(12) United States Patent
Zhao et al.

(10) Patent No.: US 12,266,747 B2
(45) Date of Patent: Apr. 1, 2025

(54) LIGHT-EMITTING SUBSTRATE, METHOD FOR FORMING THE LIGHT-EMITTING SUBSTRATE AND DISPLAY DEVICE

(71) Applicant: BOE Technology Group Co., Ltd., Beijing (CN)

(72) Inventors: Jiao Zhao, Beijing (CN); Haoliang Zheng, Beijing (CN); Li Xiao, Beijing (CN); Dongni Liu, Beijing (CN); Liang Chen, Beijing (CN); Hao Chen, Beijing (CN); Minghua Xuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 615 days.

(21) Appl. No.: 17/522,282

(22) Filed: Nov. 9, 2021

(65) Prior Publication Data
US 2022/0246812 A1 Aug. 4, 2022

(30) Foreign Application Priority Data
Jan. 29, 2021 (CN) .......................... 202110127032.8

(51) Int. Cl.
*H01L 33/62* (2010.01)
*H01L 33/00* (2010.01)
*H01L 33/38* (2010.01)

(52) U.S. Cl.
CPC ............ *H01L 33/62* (2013.01); *H01L 33/005* (2013.01); *H01L 33/38* (2013.01); *H01L 2933/0066* (2013.01)

(58) Field of Classification Search
CPC ............. H01L 25/167–50; H01L 33/62; H01L 33/005; H01L 33/38; H01L 27/124–1259;
(Continued)

(56) References Cited

U.S. PATENT DOCUMENTS

| | | | |
|---|---|---|---|
| 2010/0109052 A1* | 5/2010 | Nakajima | H01L 24/17 257/E27.06 |
| 2014/0103313 A1* | 4/2014 | Ma | H10K 59/1315 257/40 |

(Continued)

FOREIGN PATENT DOCUMENTS

| | | |
|---|---|---|
| CN | 102916036 A | 2/2013 |
| CN | 102916037 A | 2/2013 |

(Continued)

OTHER PUBLICATIONS

CN 202110127032.8 second office action.
CN 202110127032.8 first office action.

*Primary Examiner* — Syed I Gheyas
*Assistant Examiner* — Casey Paul Boatman
(74) *Attorney, Agent, or Firm* — IPro, PLLC

(57) ABSTRACT

The present disclosure discloses a light-emitting substrate, a method for forming the light-emitting substrate and a display device. The light-emitting substrate includes: a base substrate; a first signal line located at one side of the base substrate; an insulation layer located at one side of the first signal line away from the base substrate; an electrode layer located at one side of the insulation layer away from the base substrate and including a first electrode terminal, a second electrode terminal and a second signal line, where the first electrode terminal is electrically connected to the first signal line via a first through hole penetrating the insulation layer; and at least one light-emitting element bound and connected to the first electrode terminal and the second electrode terminal.

9 Claims, 1 Drawing Sheet

(58) Field of Classification Search
CPC .... H10K 59/12; H10K 59/123; H10K 59/124; H10K 59/129
See application file for complete search history.

(56) References Cited

U.S. PATENT DOCUMENTS

| | | | |
|---|---|---|---|
| 2015/0021562 A1* | 1/2015 | Kim | H10K 71/00 |
| | | | 156/247 |
| 2016/0027927 A1* | 1/2016 | Li | H01L 29/4908 |
| | | | 438/158 |
| 2016/0071919 A1* | 3/2016 | Chen | G09G 3/3225 |
| | | | 257/40 |
| 2016/0181348 A1 | 6/2016 | Ma et al. | |
| 2018/0219056 A1 | 8/2018 | Han | |
| 2019/0027549 A1 | 1/2019 | Ai et al. | |
| 2020/0028044 A1* | 1/2020 | Lee | H01L 25/0753 |
| 2020/0176477 A1 | 6/2020 | Liu et al. | |
| 2022/0375966 A1* | 11/2022 | Dong | H01L 24/05 |

FOREIGN PATENT DOCUMENTS

| | | | |
|---|---|---|---|
| CN | 106206673 A | 12/2016 | |
| CN | 107193422 A | 9/2017 | |
| CN | 108258007 A | 7/2018 | |
| CN | 109256395 A | 1/2019 | |
| CN | 109326612 A | 2/2019 | |
| CN | 111752407 A | 10/2020 | |
| CN | 112558354 A | 3/2021 | |

* cited by examiner

LIGHT-EMITTING SUBSTRATE, METHOD FOR FORMING THE LIGHT-EMITTING SUBSTRATE AND DISPLAY DEVICE

CROSS-REFERENCE TO RELATED APPLICATION

This application claims priority to Chinese Patent Application No. 202110127032.8 filed in China on Jan. 29, 2021, which is incorporated by reference in its entirety.

TECHNICAL FIELD

The present disclosure relates to the field of display technology, and in particular, to a light-emitting substrate, a method for forming the light-emitting substrate and a display device.

BACKGROUND

A Micro/Mini Light-Emitting Diode (Micro/Mini LED) is a new generation display technology, and has attracted wide attention due to low driving voltage, ultra-high brightness, long service life and high temperature resistance. Currently, a control circuit is usually formed on a substrate made of e.g., glass, in a display panel based on Micro/Mini LED technology, and electrode terminals are arranged thereon. Next, Micro/Mini LEDs are transferred to the substrate.

SUMMARY

In one aspect of the present disclosure, a light emitting substrate is provided. The light-emitting substrate includes: a base substrate; a first signal line located at one side of the base substrate; an insulation layer located at one side of the first signal line away from the base substrate; an electrode layer located at one side of the insulation layer away from the base substrate and including a first electrode terminal, a second electrode terminal and a second signal line, the first electrode terminal being electrically connected to the first signal line via a first through hole penetrating the insulation layer; and at least one light-emitting element bound and connected to the first electrode terminal and the second electrode terminal.

According to some embodiments of the present disclosure, a line width of the first signal line in any direction is larger than a line width of the second signal line.

According to some embodiments of the present disclosure, the first signal line includes a planar conductive layer.

According to some embodiments of the present disclosure, an orthographic projection of the first signal lines onto the base substrate is grid-shaped.

According to some embodiments of the present disclosure, an alloy buffer layer is further provided between the base substrate and the first signal line.

According to some embodiments of the present disclosure, both a material of which the first signal line is made and a material of which the second signal line is made include Cu.

According to some embodiments of the present disclosure, a thickness of the first signal line and a thickness of the second signal line each ranges from 1.5 µm to 2.5 µm.

According to some embodiments of the present disclosure, a line width of the first signal line and a line width of the second signal line are each not less than 100 µm.

According to some embodiments of the present disclosure, the light-emitting substrate further includes a thin film transistor layer located between the first signal line and the electrode layer, and the thin film transistor layer includes: an active layer located at the one side of the first signal line away from the base substrate; a first insulation layer covering the active layer and located at one side of the active layer away from the base substrate; a source/drain metal layer located at one side of the first insulation layer away from the base substrate, where source and drain electrodes in the source/drain metal layer are connected to the active layer via second through holes penetrating the first insulation layer; and a second insulation layer located at one side of the source/drain metal layer away from the first insulation layer, where the second signal line is connected to one of the source and drain electrodes via a third through hole penetrating the second insulation layer, and the second electrode terminal is connected to the other of the source and drain electrodes via a fourth through hole penetrating the second insulation layer. The insulation layer includes the first insulation layer and the second insulation layer.

According to some embodiments of the present disclosure, the first through hole includes: a first sub through hole extending from the electrode layer to the source/drain metal layer; and a second sub through hole extending from the source/drain metal layer to the first signal line. An orthographic projection of the first sub through hole onto the base substrate is within an orthographic projection of the second sub through hole onto the base substrate.

According to some embodiments of the present disclosure, the light-emitting substrate further includes a buffer layer between the thin film transistor layer and the first signal line.

According to some embodiments of the present disclosure, the buffer layer has a thickness greater than 0.3 µm.

According to some embodiments of the present disclosure, the light-emitting element includes a micro Light-Emitting Diode (LED).

In another aspect of the present disclosure, the present disclosure provides a method for forming a light-emitting substrate. The method includes: forming a first signal line on one side of a base substrate; forming an insulation layer on one side of the first signal line away from the base substrate; forming an electrode layer on one side of the insulation layer away from the base substrate, where the electrode layer includes a first electrode terminal, a second electrode terminal and a second signal line; enabling the first electrode terminal of the electrode layer to be electrically connected to the first signal line via a first through hole penetrating the insulation layer; and binding at least one light-emitting element to the first electrode terminal and the second electrode terminal.

According to some embodiments of the present disclosure, the first signal line and the second signal line are each formed through electroplating Cu.

According to some embodiments of the present disclosure, the light-emitting substrate further includes a thin film transistor layer located between the first signal line and the electrode layer, the thin film transistor layer includes an active layer, a first insulation layer, a source/drain metal layer and a second insulation layer, and the enabling the first electrode terminal of the electrode layer to be electrically connected to the first signal line via the first through hole penetrating the insulation layer, includes: forming the active layer and the first insulation layer successively on the one side of the first signal line away from the base substrate; where a second sub through hole is formed in the first insulation layer; forming the source/drain metal layer on one side of the first insulation layer away from the base substrate, and filling a material of which the source/drain metal layer is made in the second sub through hole; forming the second insulation layer on one side of the source/drain metal layer away from the base substrate, where a first sub through hole is formed in the second insulation layer; and forming the electrode layer and filling a material of which the electrode layer is made in the first sub through hole. The first electrode terminal is electrically connected to the first signal line through the material of which the source/drain metal layer is made in the second sub through hole and the material of which the electrode layer is made in the first sub through hole.

According to some embodiments of the present disclosure, the first signal line includes a planar conductive layer.

According to some embodiments of the present disclosure, an orthographic projection of the first signal lines onto the base substrate is grid-shaped.

According to some embodiments of the present disclosure, a thickness of the first signal line and a thickness of the second signal line each ranges from 1.5 μm to 2.5 μm; and/or, a line width of the first signal line and a line width of the second signal line are each not less than 100 μm.

In a further aspect of the present disclosure, a display device is provided in the present disclosure. The display device includes the above-mentioned light-emitting substrate.

BRIEF DESCRIPTION OF THE DRAWINGS

The above-mentioned and/or additional aspects and advantages of the present disclosure will become apparent and are easily understood in the following description with reference to the following drawings. In these drawings.

DETAILED DESCRIPTION

Figure 1:
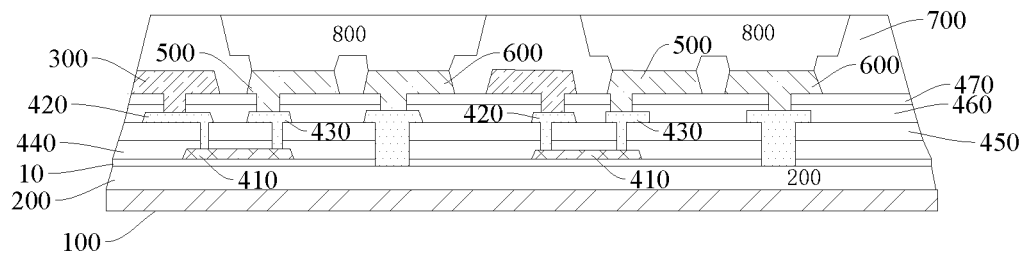
FIG. 1 shows a schematic structural diagram of a light-emitting substrate according to one embodiment of the present disclosure.

The present disclosure will be described hereinafter in conjunction with the embodiments and the drawings. Identical or similar reference numbers in the drawings represent an identical or similar element or elements having an identical or similar function. The following embodiments are for illustrative purposes only, but shall not be used to limit the scope of the present disclosure.

As compared with a driving current of an organic light emitting diode (OLED) (typically in a level of tens of nanoamperes), a driving current of a Micro/Mini-LED is in a level of microamperes, milliamperes. In addition, a LED chip operates in a low efficiency region in a Micro/Mini LED display, so a relatively large amount of heat is generated during a display process. Due to heat accumulation, red-shift of a light-emitting wavelength of the chip occurs, which adversely affects the display effect. Furthermore, a large IR drop occurs under a large current, which adversely affects the uniformity of the display.

Therefore, it is necessary to improve the light-emitting substrate and the method for forming the light-emitting substrate in the related art.

Figure 2:
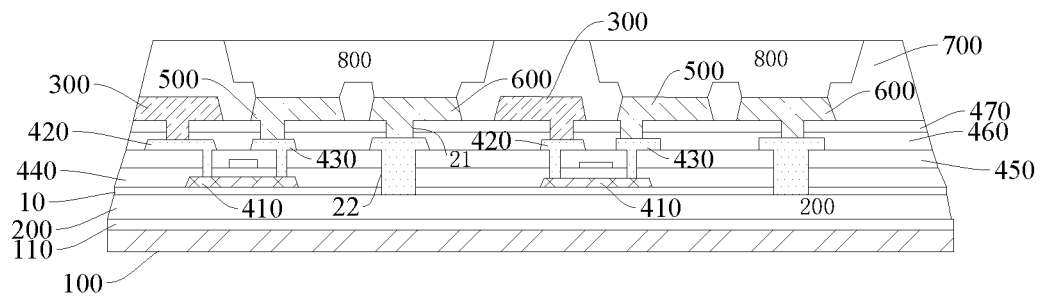
FIG. 2 shows a schematic structural diagram of a light-emitting substrate according to another embodiment of the present disclosure.

In one aspect of, a light-emitting substrate is provided in the present disclosure. Referring to FIGS. 1 and 2, the light-emitting substrate includes: a base substrate 100, a first signal line 200 located on one side of the base substrate, an insulation layer located on one side of the first signal line away from the base substrate, and an electrode layer including a second electrode terminal 500, a first electrode terminal 600 and a second signal line 300. The second signal line 300 may be electrically connected to the second electrode terminal 500. For example, the second signal line 300 and the second electrode terminal 500 may be electrically connected to source and drain electrodes (denoting as 420 and 430 shown in the drawing) of a thin film transistor respectively. The first electrode terminal 600 is electrically connected to the first signal line 200 via a first through hole penetrating the insulation layer. The light-emitting substrate further includes at least one light-emitting element 800 which is bound and connected to the first electrode terminal 600 and the second electrode terminal 500.

In some embodiments, the insulation layer may include a first insulation layer 440 and a second insulation layer 460.

Thus, when a region occupied by the first signal line in the light-emitting substrate is increased, for example, a line width of the first signal line 200 may be increased, it is able to reduce the IR drop of a wire and effectively reduce a power consumption of the light-emitting substrate. In particular, when the light-emitting substrate is applied to a large-size display device, such as a TV-level display device, it is further able to improve a heat dissipation capability of the large-size display device, reduce the power consumption, and prevent the IR drop of the wire.

It has been found that, in order to reduce the IR drop, although in some light-emitting substrates, the wire is of a multi-layer metal (e.g., Ti/Al/Ti) alloy structure or formed by electroplating Cu to form a thick single-layer structure, so as to reduce a wiring resistance R of the second signal line and the first signal line it is still not possible for the above designs to address the problems of IR drop and heat dissipation in a large-size (e.g. TV-level) panel. It has been further found that, when the second signal line and the first signal line are arranged in different layers, for example, respectively on both sides of the thin film transistor, on one hand, an area of the lower first signal line 200 may be increased so as to reduce the wiring resistance, and on the other hand, more space may be saved for the second signal line 300, and it is also able to increase a line width of the second signal line. Furthermore, since the first signal line 200 is located on the base substrate 100, it is able to be designed to be an entire metal layer, and the heat generated by the light emitting diode (LED) connected to the second electrode terminal 500 and the first electrode terminal 600 may be transferred to the first signal line 200 having a relatively large area via the first electrode terminal 600 and the through hole, thereby achieving better heat dissipation and effectively inhibiting chromatic aberration caused by the heat accumulation.

According to the embodiments of the present disclosure, specific types of the first signal line, the second signal line, the first electrode terminal and the second electrode terminal are not particularly defined. For example, the first signal line may be a cathode power source line, the second signal line may be an anode power source line. Similarly, the first electrode terminal may be a cathode terminal, and the second electrode terminal may be an anode terminal.

According to specific embodiments of the present disclosure, each structure of the light-emitting substrate is described below in detail.

According to the embodiments of the present disclosure, the line width of the first signal line in any direction may be greater than the line width of the second signal line.

As described above, the first signal line may be used for heat dissipation, when the first signal line has a larger size, it is able to improve the heat dissipation capability of the light-emitting substrate. In the present disclosure, "in any direction" may refer to a line width of the first signal line along a direction parallel to the base substrate and perpendicular to an extending direction of the first signal line. In other words, any direction may be referred to as any direction parallel to a plane where the base substrate is located.

Specifically, the first signal line 200 may be a planar conductive layer. The planar conductive layer may be formed on an entire surface of the base substrate. Thus, it is further able to reduce the IR drop of the wire, and facilitate heat dissipation in a better manner.

According to some further embodiments of the present disclosure, an orthographic projection of the first signal line onto the base substrate may be grid-shaped.

Therefore, the first signal line may have the relatively large area, and it is able to reduce the voltage drop of the wire and improve the heat dissipation effect.

According to the embodiments of the present disclosure, both a material of which the first signal line 200 is made and a material of which the second signal line 300 is made may include Cu.

Thus, it is able to improve the electrical properties of the first signal line 200 and the second signal line 300. In order to ensure the electrical properties of the first signal line 200 and the second signal line 300 and improve the heat dissipation capability of the whole light-emitting substrate, thicknesses of the first signal line 200 and the second signal line 300 may each be relatively large, e.g., ranges from 1.5 μm to 2.5 μm, and specifically, about 2 μm microns. Thicknesses of other metal wires (e.g. a source line) in the light-emitting substrate may each be about 0.6 μm. According to the embodiments of the present disclosure, line widths of the first signal line 200 and the second signal line 300 may also each be large, and specifically, may each not less than 100 μm. Thus, it is further able to reduce the IR drop of the wire.

As described above, the first signal line 200 and the second signal line 300 are arranged in different layers in the present disclosure, so the area of each of the first signal line 200 and the second signal line 300 may be relatively large. For example, the first signal line 200 may be the planar conductive layer as described above, or a structure formed by multiple metal blocks connected to each other, namely, the orthographic projection thereof onto the base substrate may be grid-shaped. Similarly, the second signal line 300 may also be grid-shaped, so it is further able to reduce the IR drop of the second signal line 300.

According to the embodiments of the present disclosure, in order to further improve adhesion capability between the base substrate and the first signal line 200, referring to FIG. 2, an alloy buffer layer 110 may be further provided between the base substrate 100 and the first signal line 200. A thickness and a material of the alloy buffer layer 110 are not particularly defined. For example, the base substrate 100 may be made of glass, and if a Cu layer having a relatively large thickness is formed directly on the glass, such defects as a phenomenon of the first signal line peeling off from the base substrate may occur. Thus, the alloy buffer layer 110 may be formed on the base substrate 100 made of glass in advance, so as to mitigate or avoid the occurrence of phenomenon of the first signal line peeling off from the base substrate.

According to the embodiments of the present disclosure, a thin film transistor layer may be further provided between the first signal line and the electrode layer. Referring to FIG. 2, the thin film transistor layer may specifically include such structures as an active layer 410, a source/drain metal layer including source and drain electrodes (420 and 430), a gate electrode, etc. In some embodiments, the thin film transistor layer may include the active layer 410, a first insulation layer 440, the source/drain metal layer and a second insulation layer 460. The active layer 410 is located at one side of the first signal line 200 away from the base substrate 100, and a first insulation layer 440 covers the active layer 410 and is located at one side of the active layer away from the base substrate. For example, the first insulation layer 440 may be a gate insulation layer which enables the gate electrode to be insulated and separated from the active layer 410. The source/drain metal layer is located at one side of the first insulation layer 440 away from the base substrate, and the source and drain electrodes (420 and 430) in the source/drain metal layer may be connected to the active layer 410 via second through holes penetrating the first insulation layer. The second insulation layer 460 may be located at one side of the source/drain metal layer away from the first insulation layer. Specifically, the second insulation layer 460 may be a planarization layer. The second signal line 300 is connected to one of the source and drain electrodes via a third through hole penetrating the second insulation layer, and the second electrode terminal 500 is connected to the other of the source and drain electrodes via a fourth through hole penetrating the second insulation layer. The thin film transistor layer may further include such structures as an interlayer insulation layer 450 and a passivation layer 470, so as to further improve the performance of thin film transistors in the thin film transistor layer.

According to the embodiments of the present disclosure, the first through hole through which the first electrode terminal 600 is connected to the first signal line 200 may include a first sub through hole 21 and a second sub through hole 22. Specifically, the first sub through hole 21 may extend from the electrode layer to the source/drain metal layer. The second sub through hole 22 may extend from the source/drain metal layer to the first signal line, and an orthographic projection of the first sub through hole onto the base substrate is within an orthographic projection of the second sub through hole onto the base substrate.

In other words, a diameter of the first sub through hole may be smaller than a diameter of the second sub through hole. Thus, it is able to inhibit cross-flow at the through holes. Specifically, in the case that the through holes through which the first electrode terminal 600 is connected to the first signal line 200 having a same diameter, the diameter of the through holes is required to be large in order to ensure a certain heat conduction capability in the through holes. However, when the diameter of the through holes is large, cross-flow occurs easily. Therefore, the first sub through hole and the second sub through hole are of the aforementioned structure in the present disclosure. That is, the first sub through hole may extend to the source/drain metal layer and may be filled with a material of which the first signal line 200 is made, such as Cu. The diameter of the first sub through hole may be relatively small. The second sub through hole may be filled with a material of which the source/drain metal layer is made and extend to the first signal line 200. The diameter of the second sub through hole 22 may be larger, so as to achieve a better heat conduction effect.

It has been further found that, since the thickness of the first signal line 200 is large, and the first signal line 200 may be formed by electroplating in view of saving production costs. A surface flatness of the resultant first signal line 200 is poor, and in the case that a subsequent structure such as the thin film transistor layer (including multiple thin film transistors) is directly formed on the first signal line 200, the performance of the thin film transistors may be adversely affected. Therefore, a buffer layer 10 may be further provided between the thin film transistor layer and the first signal line 200. The material of the buffer layer 10 is not particularly defined, and for example, may be a material of which a buffer layer of a thin film transistor is usually made. In order to improve the flatness of the first signal lines 200, a thickness of the buffer layer 10 may be relatively large. For example, it may be greater than 0.3 µm. Thus, it is able to improve the flatness of the surface when forming the thin film transistor.

Figure 3:
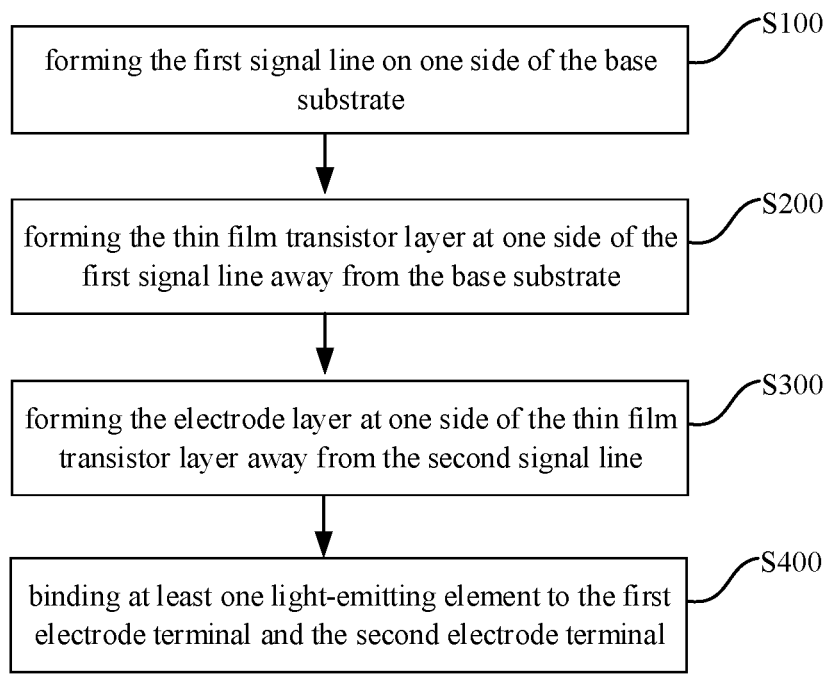
FIG. 3 shows a flow chart of a method for forming a light-emitting substrate according to one embodiment of the present disclosure.

In another aspect, a method for forming the above-mentioned light-emitting substrate is further provided in the present disclosure. According to the embodiments of the present disclosure, referring to FIG. 3, the method may include forming the first signal line at one side of the base substrate, forming the insulation layer at one side of the first signal line away from the base substrate; forming the electrode layer at one side of the insulation layer away from the base substrate, where the electrode layer includes a first electrode terminal, a second electrode terminal and a second signal line, enabling the first electrode terminal of the electrode layer to be electrically connected to the first signal line via a first through hole penetrating the insulation layer; and binding at least one light-emitting element to the first electrode terminal and the second electrode terminal.

Thus, it is able to obtain the above-mentioned light-emitting substrate easily.

According to some embodiments of the present disclosure, the method may specifically include the following steps.

S100, forming the first signal line on one side of the base substrate.

According to the embodiments of the present disclosure, the first signal line is first formed in this step. Positions, materials and shapes of the first signal lines have been described in detail above and will not be repeated herein.

According to one specific embodiment of the present disclosure, for example, the alloy buffer layer may be firstly formed on the base substrate in the step. Next, a Cu metal layer having a relatively large thickness may be formed as the first signal line by using an electroplating process. In some embodiments, an etching process may further be performed on the metal layer, so as to form the first signal lines of which the orthographic projection onto the base substrate is grid-shaped. According to the embodiments of the present disclosure, when the first signal line is formed by using an electroplating process, it is able to obtain the metal layer with a sufficient thickness conveniently. As compared with a sputtering deposition process, the electroplating process has a lower process requirement, and it is able to form the metal layer with the sufficient thickness conveniently through the electroplating process.

S200, forming the thin film transistor layer at one side of the first signal line away from the base substrate.

According to the embodiments of the present disclosure, such a circuit structure as the thin film transistor layer is formed at the one side of the first signal line in the step. With regard to the specific structure of the thin film transistor layer, a detailed description has been given above, which will not be repeated herein.

Specifically, in the step, the buffer layer having the large thickness may further be formed in advance at the one side of the first signal line, so as to improve the flatness of the surface on which the thin film transistor layer is formed. The buffer layer may be made of a material of which the active layer is usually made of, and the thickness thereof may be larger.

According to the embodiments of the present disclosure, during forming the thin film transistor layer, the first through hole through which the first electrode terminal is connected to the first signal line may be further formed. Specifically, the light-emitting substrate further includes the thin film transistor layer located between the first signal line and the electrode layer, the thin film transistor layer includes the active layer, the first insulation layer, the source/drain metal layer and the second insulation layer, and the enabling the first electrode terminal of the electrode layer to be electrically connected to the first signal line via the first through hole penetrating the insulation layer, includes: forming the active layer and the first insulation layer successively on the one side of the first signal line away from the base substrate; where a second sub through hole is formed in the first insulation layer; forming the source/drain metal layer on one side of the first insulation layer away from the base substrate, and filling a material of which the source/drain metal layer is made in the second sub through hole; forming the second insulation layer on one side of the source/drain metal layer away from the base substrate, where a first sub through hole is formed in the second insulation layer; and forming the electrode layer and filling a material of which the electrode layer is made in the first sub through hole. The first electrode terminal is electrically connected to the first signal line through the material of which the source/drain metal layer is made in the second sub through hole and the material of which the electrode layer is made in the first sub through hole.

The projection of the first sub through hole onto the base substrate needs to be within the projection of the second sub through hole onto the base substrate, namely, the diameter of the first sub through hole may be smaller than the diameter of the second sub through hole. Thus, it is not only to enable the subsequently formed first electrode terminal to be connected to the first signal line, but also to prevent the occurrence of cross-flow at the through holes.

S300, forming the electrode layer at one side of the thin film transistor layer away from the second signal line.

According to the embodiments of the present disclosure, the electrode layer is formed in this step, and may include the second electrode terminal, the first electrode terminal and the second signal line. Specifically, the thickness of the second signal line may be relatively large. For example, the second signal line may be formed by electroplating Cu.

S400, binding at least one light-emitting element to the first electrode terminal and the second electrode terminal.

Thus, it is able to obtain the light-emitting substrate described above.

In another aspect, a display device is provided in the present disclosure. The display device includes the above-mentioned light-emitting substrate. Thus, the display device has all the features and advantages of the light-emitting substrate described above, which will not be repeated herein.

According to the embodiments of the present disclosure, referring to FIG. 2, the display device further includes multiple light-emitting elements, which may be light-emitting diodes 800 connected to both the second electrode terminal 500 and the first electrode terminal 600 in the light-emitting substrate. The light emitting diodes 800 may be bound to the second electrode terminal 500 and the first electrode terminal 600 by using manners including, but not limited to, mass transfer. To further improve the performance of the display device, the display device may further include a black adhesive layer 700.

Specifically, the black adhesive layer 700 may include two sub-layers (not shown). In order to prevent light of the light emitting diodes 800 from diffusing into the thin film transistors, which adversely affects the performance of the thin film transistors, a light-blocking black adhesive may be coated on a surface of the electrode layer in advance before binding the light emitting diodes 800, and then the light-blocking black adhesive is patterned, so as to expose connection terminals of the electrode layer and a power source line. After binding the light emitting diodes 800, a coating process of an anti-crosstalk black adhesive may be performed, so as to prevent light crosstalk among the multiple light-emitting diodes. The anti-crosstalk black adhesive may completely cover the multiple light-emitting diodes 800 and fill gaps between the light emitting diodes 800. The anti-crosstalk black adhesive may then be milled to expose light-emitting surfaces of the multiple light-emitting diodes 800.

According to the embodiments of the present disclosure, the term "light-emitting diode" should be construed in a broad sense, it may mean a light-emitting element including only one LED or a light-emitting chip including at least one LED and such a structure as a package structure. The light-emitting chip including at least one LED and such the structure as the packaging structure or the single LED may be bound to the above-mentioned light-emitting substrate through the second electrode terminal 500 and the first electrode terminal 600.

In the descriptions of this specification, descriptions with reference to the terms such as "an embodiment", "some embodiments", "examples", "specific examples", or "some examples" mean that specific features, structures, materials, or characteristics described in conjunction with the embodiment(s) or example(s) are included in at least one embodiment or example of the present disclosure. In this specification, the illustrative representations of the above terms do not necessarily refer to the same embodiments or examples. Moreover, the specific features, structures, materials, or characteristics as described may be combined in any one or more embodiments or examples in an appropriate manner. In addition, without contradicting each other, those skilled in the art may join and combine different embodiments or examples and features of the different embodiments or examples described in this specification.

Although the embodiments of the present disclosure are illustrated and described in the above, it should be appreciated that the above embodiments are illustrative and should not be construed as limiting the present disclosure. Changes, modifications, substitutions and variations of the above embodiments may be made by those of ordinary shill in the art within the scope of the present disclosure.

What is claimed is:

1. A light-emitting substrate, comprising:
a base substrate;
a first signal line located at one side of the base substrate;
an insulation layer located at one side of the first signal line away from the base substrate;
an electrode layer located at one side of the insulation layer away from the base substrate and comprising a first electrode terminal, a second electrode terminal and a second signal line, the first electrode terminal being electrically connected to the first signal line via a first through hole penetrating the insulation layer; and
at least one light-emitting element bound and connected to the first electrode terminal and the second electrode terminal;
wherein the first signal line and the second signal line are arranged at different layers;
wherein the light-emitting substrate further comprises a thin film transistor layer located between the first signal line and the electrode layer, wherein the thin film transistor layer comprises:
an active layer located at the one side of the first signal line away from the base substrate;
a first insulation layer covering the active layer and located at one side of the active layer away from the base substrate;
a source/drain metal layer located at one side of the first insulation layer away from the base substrate, wherein source and drain electrodes in the source/drain metal layer are connected to the active layer via second through holes penetrating the first insulation layer; and
a second insulation layer located at one side of the source/drain metal layer away from the first insulation layer, wherein the second signal line is connected to one of the source and drain electrodes via a third through hole penetrating the second insulation layer, and the second electrode terminal is connected to the other of the source and drain electrodes via a fourth through hole penetrating the second insulation layer;
wherein the insulation layer comprises the first insulation layer and the second insulation layer;
wherein the first through hole comprises:
a first sub through hole extending from the electrode layer to the source/drain metal layer; and
a second sub through hole extending from the source/drain metal layer to the first signal line;
wherein an orthographic projection of the first sub through hole onto the base substrate is within an orthographic projection of the second sub through hole onto the base substrate, the orthographic projection of the first sub through hole onto the base substrate is smaller than the orthographic projection of the second sub through hole onto the base substrate, and a diameter of the first sub through hole is smaller than a diameter of the second sub through hole;
wherein an alloy buffer layer is further provided between the base substrate and the first signal line;
wherein both a material of which the first signal line is made and a material of which the second signal line is made comprise Cu;
wherein a thickness of the first signal line and a thickness of the second signal line each ranges from 1.5 µm to 2.5 µm;
wherein a line width of the first signal line and a line width of the second signal line are each not less than 100 µm;
wherein the light-emitting substrate further comprises a buffer layer between the thin film transistor layer and the first signal line;
wherein the buffer layer has a thickness greater than 0.3 µm.

2. The light-emitting substrate according to claim 1, wherein a line width of the first signal line in any direction is larger than a line width of the second signal line.

3. The light-emitting substrate according to claim 2, wherein the first signal line comprises a planar conductive layer.

4. The light-emitting substrate according to claim 1, wherein the light-emitting element comprises a micro Light-Emitting Diode (LED).

5. A display device, comprising the light-emitting substrate according to claim 1.

6. A method for forming a light-emitting substrate, comprising:
   forming a first signal line on one side of a base substrate;
   forming an insulation layer on one side of the first signal line away from the base substrate;
   forming an electrode layer on one side of the insulation layer away from the base substrate,
   wherein the electrode layer comprises a first electrode terminal, a second electrode terminal and a second signal line;
   enabling the first electrode terminal of the electrode layer to be electrically connected to the first signal line via a first through hole penetrating the insulation layer; and
   binding at least one light-emitting element to the first electrode terminal and the second electrode terminal;
   wherein the light-emitting substrate further comprises a thin film transistor layer located between the first signal line and the electrode layer, the thin film transistor layer comprises an active layer, a first insulation layer, a source/drain metal layer and a second insulation layer, and the enabling the first electrode terminal of the electrode layer to be electrically connected to the first signal line via the first through hole penetrating the insulation layer, comprises:
   forming the active layer and the first insulation layer successively on the one side of the first signal line away from the base substrate; wherein a second sub through hole is formed in the first insulation layer;
   forming the source/drain metal layer on one side of the first insulation layer away from the base substrate, and filling a material of which the source/drain metal layer is made in the second sub through hole;
   forming the second insulation layer on one side of the source/drain metal layer away from the base substrate, wherein a first sub through hole is formed in the second insulation layer; and
   forming the electrode layer and filling a material of which the electrode layer is made in the first sub through hole; wherein the first electrode terminal is electrically connected to the first signal line through the material of which the source/drain metal layer is made in the second sub through hole and the material of which the electrode layer is made in the first sub through hole;
   wherein an orthographic projection of the first sub through hole onto the base substrate is within an orthographic projection of the second sub through hole onto the base substrate, the orthographic projection of the first sub through hole onto the base substrate is smaller than the orthographic projection of the second sub through hole onto the base substrate, and a diameter of the first sub through hole is smaller than a diameter of the second sub through hole;
   wherein an alloy buffer layer is further provided between the base substrate and the first signal line;
   wherein both a material of which the first signal line is made and a material of which the second signal line is made comprise Cu;
   wherein a thickness of the first signal line and a thickness of the second signal line each ranges from 1.5 μm to 2.5 μm;
   wherein a line width of the first signal line and a line width of the second signal line are each not less than 100 μm;
   wherein the light-emitting substrate further comprises a buffer layer between the thin film transistor layer and the first signal line;
   wherein the buffer layer has a thickness greater than 0.3 μm.

7. The method according to claim 6, wherein the first signal line comprises a planar conductive layer.

8. The display device according to claim 5, wherein a line width of the first signal line in any direction is larger than a line width of the second signal line.

9. The display device according to claim 8, wherein the first signal line comprises a planar conductive layer.

* * * * *